(12) United States Patent
Bahr et al.

(10) Patent No.: US 11,228,280 B1
(45) Date of Patent: Jan. 18, 2022

(54) MICROELECTROMECHANICAL SYSTEM RESONATOR-BASED OSCILLATOR

(71) Applicant: TEXAS INSTRUMENTS INCORPORATED, Dallas, TX (US)

(72) Inventors: Bichoy Bahr, Allen, TX (US); Sachin Kalia, Dallas, TX (US); Swaminathan Sankaran, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/164,588

(22) Filed: Feb. 1, 2021

(51) Int. Cl.
*H03B 5/36* (2006.01)
*H03B 5/04* (2006.01)
*H03B 5/30* (2006.01)
*H03B 5/12* (2006.01)

(52) U.S. Cl.
CPC ............... *H03B 5/36* (2013.01); *H03B 5/04* (2013.01); *H03B 5/12* (2013.01); *H03B 5/30* (2013.01)

(58) Field of Classification Search
CPC ... H03B 5/12; H03B 5/04; H03B 5/30; H03B 5/36
USPC ............ 331/167, 154, 117 FE, 116 M
See application file for complete search history.

(56) References Cited

U.S. PATENT DOCUMENTS 10,312,185 B2 * 6/2019 Bahr ............... H01L 23/49548

* cited by examiner

*Primary Examiner* — Arnold M Kinkead
(74) *Attorney, Agent, or Firm* — Mark Allen Valetti; Charles A. Brill; Frank D. Cimino (57) ABSTRACT

A device includes a MEMS resonator and oscillator circuit coupled to the MEMS resonator. The circuit includes a first transistor having a first control terminal and first and second current terminals, and a second transistor having a second control terminal and third and fourth current terminals. The circuit includes a resonator coupling network configured to inductively couple MEMS resonator terminals to the first and third current terminals, and to couple the first and third current terminals. The circuit includes a control terminal coupling network configured to couple the first and second control terminals, and to reduce a voltage swing at the first and second control terminals relative to a voltage swing at the first and third current terminals. The circuit includes a second terminal coupling network configured to couple the second and fourth current terminals. A second terminal coupling network resonant frequency is approximately that of MEMS resonator.

21 Claims, 5 Drawing Sheets

MICROELECTROMECHANICAL SYSTEM RESONATOR-BASED OSCILLATOR

BACKGROUND

Microelectromechanical system (MEMS) resonators are used as low-power, low-phase noise, high-stability oscillators in various applications. In some cases, a MEMS resonator is coupled to an oscillator circuit and used as a clock source in a variety of electronic circuits. Such a clock source provides frequency control and/or timing for various devices such as mobile phones, radio transmitters, and more complex devices such as computers and navigational aids.

SUMMARY

In an example of this description, a device includes a microelectromechanical system (MEMS) resonator and an oscillator circuit coupled to the MEMS resonator. The oscillator circuit includes a first transistor having a first control terminal and first and second current terminals, and a second transistor having a second control terminal and third and fourth current terminals. The circuit includes a resonator coupling network configured to inductively couple MEMS resonator terminals to the first and third current terminals, and to couple the first and third current terminals. The circuit includes a control terminal coupling network configured to couple the first and second control terminals, and to reduce a voltage swing at the first and second control terminals relative to a voltage swing at the first and third current terminals. The circuit includes a second terminal coupling network configured to couple the second and fourth current terminals. A second terminal coupling network resonant frequency is approximately that of MEMS resonator.

In another example of this description, a device includes a MEMS resonator having a first MEMS terminal and a second MEMS terminal. The device also includes an oscillator circuit coupled to the MEMS resonator. The oscillator circuit includes a first transistor having a first control terminal, a first current terminal and a second current terminal; a second transistor having a second control terminal, a third current terminal and a fourth current terminal; a transformer including a primary coil coupled to the first current terminal and the third current terminal, and a secondary coil coupled to the first and second MEMS terminals; a control terminal coupling network coupled between the first and second control terminals; and a second terminal coupling network coupled between the second and fourth current terminals, the second terminal coupling network comprising a series-connected first capacitor, inductor and second capacitor.

In yet another example of this description, a device includes including a MEMS resonator having a first MEMS terminal and a second MEMS terminal. The device also includes an oscillator circuit coupled to the MEMS resonator. The oscillator circuit includes a first transistor having a first control terminal, a first current terminal and a second current terminal; a second transistor having a second control terminal, a third current terminal and a fourth current terminal; and a coupling network configured to couple the second current terminal to the fourth current terminal. The coupling network has a resonant frequency approximately equal to a resonant frequency of the MEMS resonator. The device also includes a transformer including a primary coil coupled to the first transistor first terminal and to the second transistor first terminal, a secondary coil coupled to the first MEMS terminal and the second MEMS terminal, and a tertiary coil coupled to the first control terminal and the second control terminal.

BRIEF DESCRIPTION OF THE DRAWINGS

The same reference numbers are used throughout the drawings to designate features that are the same or similar (with respect to function and/or structure).

DETAILED DESCRIPTION

In some cases, it is challenging to couple a MEMS resonator to an oscillator circuit while maintaining sufficient levels of phase noise, power consumption, and oscillation stability. Various components (e.g., transistors, resistors) of the oscillator circuit are tuned to reduce circuit nonlinearities and thus flicker noise, which exists primarily due to electrical noise from those components. However, thermal noise is not eliminated by tuning circuit components and thus still impacts the overall noise performance of the oscillator circuit.

Examples of this description mitigate thermal noise by increasing the amplitude of an output signal provided by the oscillator circuit (e.g., an oscillator signal), which has the effect of reducing the signal-to-noise ratio (SNR) of the oscillator despite the thermal noise. However, in some examples, increasing the amplitude of the oscillator signal uses components (e.g., transistors) having higher voltage ratings, which may have a decreased switching speed and present increased capacitance to the MEMS resonator. To counteract the decreased switching speed and effectively reduce the impedance presented by the increased capacitance of such devices, examples of this description include an oscillator circuit that is inductively coupled to a MEMS resonator (e.g., via a transformer). The inductive coupling between the MEMS resonator and the oscillator circuit effectively cancels some or all of the increased capacitance of the higher-voltage transistors used in the oscillator circuit. In an example in which the transistors are bipolar junction transistors (BJTs), the increased capacitance is due to increased base capacitance from the BJT being rated for a higher voltage to accommodate increased oscillator signal amplitude. These and other examples are described below.

Figure 1:
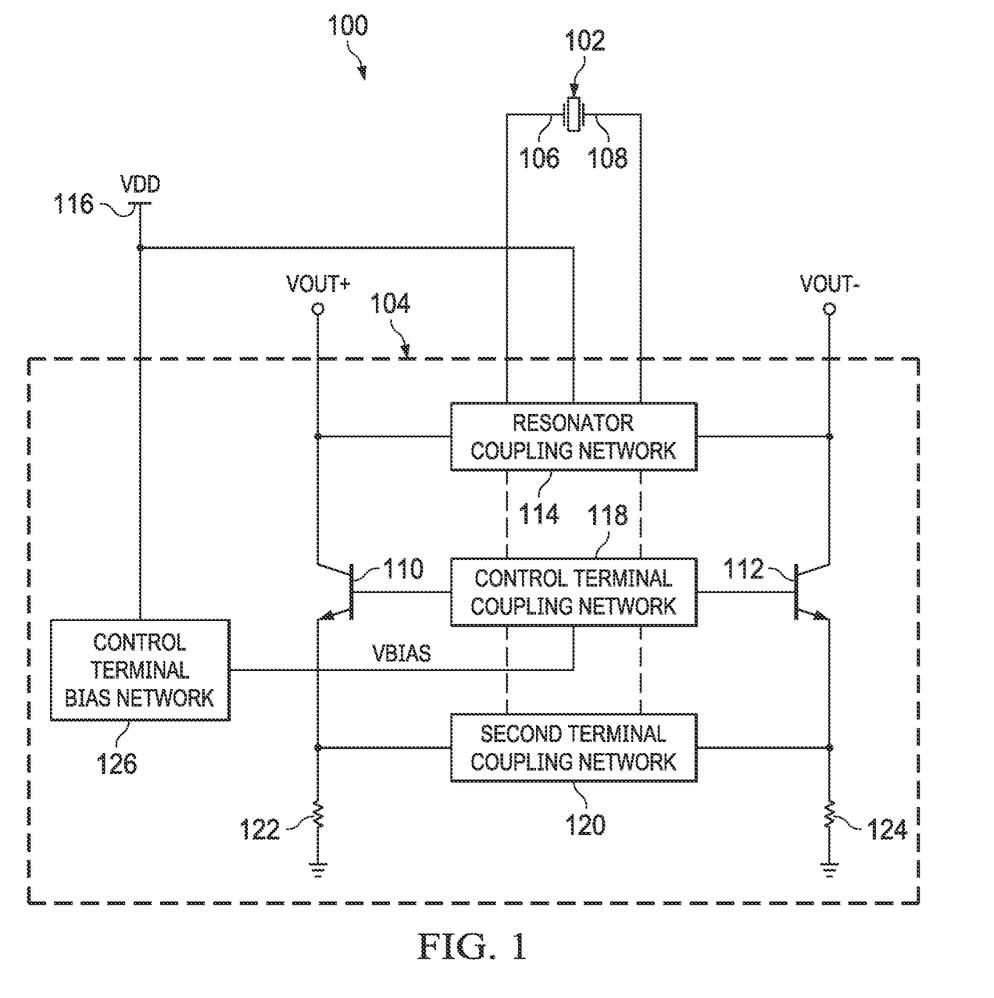
FIGS. 1 and 2 are schematic diagrams of MEMS resonators coupled to oscillator circuits with coupling networks in various examples.

FIG. 1 is a schematic diagram of a system 100 in accordance with examples of this description. The system 100 includes a MEMS resonator 102 coupled to an oscillator circuit 104. In one example, the MEMS resonator 102 is a thin-film bulk acoustic wave (BAW) resonator that includes a piezoelectric material sandwiched between two electrodes. The MEMS resonator 102 includes terminals 106, 108 that facilitate inductively coupling to the oscillator circuit 104, described below.

The oscillator circuit 104 includes a first transistor 110 and a second transistor 112, which are BJTs in this example. The first and second transistors 110, 112 each includes a control terminal (e.g., a base), a first terminal (e.g., a collector), and a second terminal (e.g., an emitter). The first and second transistors 110, 112 are referred to as BJTs in the following examples. However, as described below, the first and second transistors 110, 112 may be different types of transistors (e.g., field-effect transistors (FETs)) in other examples. As described below, the first and second BJTs 110, 112 form a cross-coupled, differential pair with the collectors of the BJTs 110, 112 providing the oscillator signal as a differential output. In the example of FIG. 1, the collector of the first BJT 110 provides a positive differential output signal (the voltage at which is labeled VOUT+) at a positive output terminal and the collector of the second BJT 112 provides a negative differential output signal (the voltage at which is labeled VOUT−) at a negative output terminal.

The oscillator circuit 104 also includes a resonator coupling network 114 that is configured to inductively couple the MEMS resonator 102 to the first BJT 110 collector and to the second BJT 112 collector. The resonator coupling network 114 also couples the first BJT 110 collector to the second BJT 112 collector. A supply voltage terminal 116 (the voltage at which is labeled VDD) is coupled to the resonator coupling network 114 and, as described below, enables relatively large swings (e.g., greater than VDD) at the collectors of the first and second BJTs 110, 112 and on the terminals 106, 108 of the MEMS resonator 102.

The oscillator circuit 104 also includes a control terminal (e.g., base) coupling network 118 that is configured to couple the first BJT 110 base to the second BJT 112 base. In some examples, the control terminal coupling network 118 is also coupled to the resonator coupling network 114 (e.g., indicated by dashed lines) to provide a feedback path for the oscillator circuit 104 to function. In certain examples where the first and second transistors 110, 112 are BJTs, the control terminal coupling network 118 is also configured to reduce a voltage swing at the bases of the first and second BJTs 110, 112 relative to a voltage swing at the collectors of the first and second BJTs 110, 112. Reducing the voltage swing on the bases of the first and second BJTs 110, 112 relative to the voltage swing on the collectors of the first and second BJTs 110, 112 reduces nonlinearities in the oscillator circuit 104 because the base-emitter junction of the BJTs 110, 112 operate in a forward biased mode. Because the base-emitter junction of the BJTs 110, 112 is a pn junction, increased voltage swings cause exponentially higher current flow, which provides increased nonlinearities. Also, reducing the voltage swing on the bases relative to the collectors avoids saturating the BJTs 110, 112. In addition, flicker noise up-conversion of the oscillator circuit 104 is reduced because of the reduced nonlinearities. The reduced nonlinearities results from reducing the impact of base capacitance of the BJTs 110, 112 by inductively coupling the MEMS resonator 102 to the BJTs 110, 112 (e.g., using the control terminal coupling network 118). A bias voltage (the value of which is labeled VBIAS) is provided to the control terminal coupling network 118 to adjust an operating point and/or an amplitude of the oscillator circuit 104.

The oscillator circuit 104 also includes a second terminal (e.g., emitter) coupling network 120 that is configured to couple the first BJT 110 emitter to the second BJT 112 emitter. In some examples, the second terminal coupling network 120 is also coupled to the resonator coupling network 114 and/or the control terminal coupling network 118 (e.g., indicated by dashed lines) to provide a feedback path for the oscillator circuit 104 to function. The second terminal coupling network 120 is a resonant circuit that has a resonant frequency approximately equal to a resonant frequency of the MEMS resonator 102. By coupling the emitters of the first and second BJTs 110, 112 with a resonant frequency similar to that of the MEMS resonator 102, the second terminal coupling network 120 provides increased loop gain around the resonant frequency. Thus, the second terminal coupling network 120 provides stability for the oscillator circuit 104 at the resonant frequency of the MEMS resonator 102 because it reduces the tendency of the oscillator circuit 104 to oscillate at frequencies other than the resonant frequency of the MEMS resonator 102. In some examples, the second terminal coupling network 120 has a common mode resonant frequency at a second harmonic, which reduces noise present in the oscillator circuit 104. A first resistor 122 is coupled to the first BJT 110 emitter and to a ground terminal and a second resistor 124 is coupled to the second BJT 112 emitter and to the ground terminal. The resistors 122, 124 provide an emitter degeneration that reduces gain away from the resonant frequency of the second terminal coupling network 120. The resistors 122, 124 also limit the current through the oscillator circuit 104, which provides amplitude and frequency stability.

As described above, a bias voltage (VBIAS) is provided to the control terminal coupling network 118 to adjust an operating point and/or an amplitude of the oscillator circuit 104. In some examples, VBIAS is provided by a reference voltage source. However, in other examples, the oscillator circuit 104 includes a control terminal bias network 126 that is configured to provide VBIAS as a programmable bias voltage. As described below, the control terminal bias network 126 enables VBIAS to be programmable to control operation of the first and second BJTs 110, 112 across various conditions (e.g., across process and temperature) so the oscillator circuit 104 provides sufficiently low phase noise irrespective of those conditions.

Figure 2:
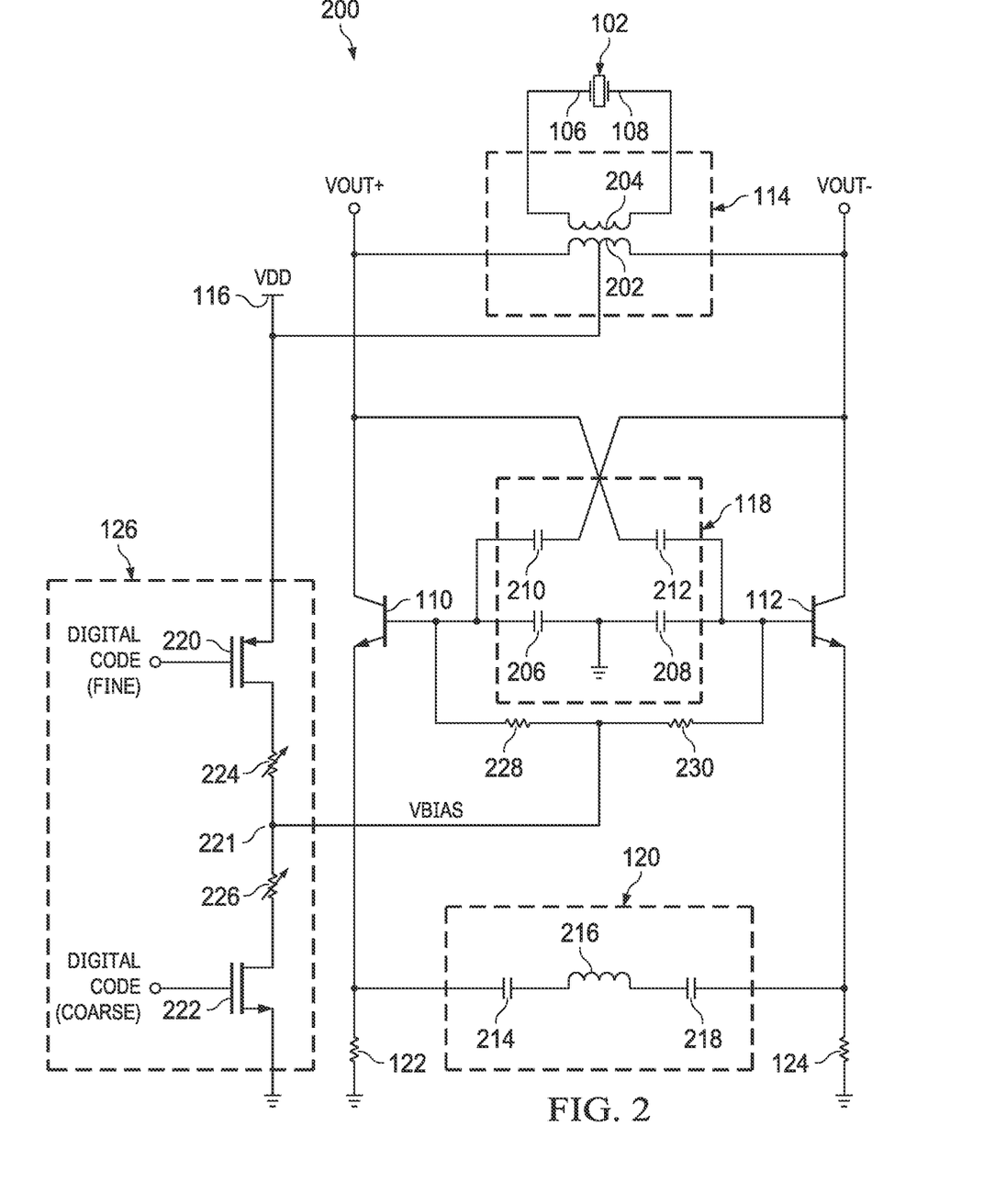

FIG. 2 is a schematic diagram of a system 200 including the MEMS resonator 102 and the oscillator circuit 104. In FIG. 2, the resonator coupling network 114, the control terminal coupling network 118, the second terminal coupling network 120, and the control terminal bias network 126 are shown in detail in accordance with various examples.

The resonator coupling network 114 is a transformer that includes a primary coil 202 and a secondary coil 204. The primary coil 202 is coupled to the first BJT 110 collector and to the second BJT 112 collector. The secondary coil 204 is coupled to the terminals 106, 108 of the MEMS resonator 102. In some examples, a turn ratio between the primary coil 202 and the secondary coil 204 is higher on the oscillator circuit side (e.g., the primary coil 202 has more turns than the secondary coil 204) to reduce power consumption. In other examples, the turn ratio is higher on the MEMS resonator 102 side (e.g., the secondary coil 204 has more turns than the primary coil 202) to provide oscillator performance. Implementing the resonator coupling network 114 as a transformer provides an inductive coupling between the MEMS resonator 102 and the oscillator circuit 104, which effectively cancels some or all of the increased base capacitance (e.g., due to the positive reactance of an inductor summed with the negative reactance of a capacitor) due to the BJTs 110, 112 being rated for a higher voltage. Accordingly, limitations on an intrinsic BJT 110, 112 gain frequency $f_T$ (e.g., a frequency at which the current into the BJT 110, 112 base is approximately equal to the current from the collector, and thus no gain is provided) are reduced because the transformer 114 tunes out or reduces the impact of the base capacitance of the BJTs 110, 112, which allows for BJTs 110, 112 having a larger base capacitance and lower transconductance (gm). Also, the primary coil 202 is coupled to the supply voltage terminal 116, which enables relatively large voltage swings (e.g., up to two times VDD) for the oscillator signal at the output terminals VOUT+ and VOUT−. In some examples, the oscillator signal peak-to-peak amplitude is less than two times VDD for practical reasons (e.g., avoiding increased nonlinearities, avoiding forward-biasing BJT 110, 112 junctions, and avoiding overall degradation of oscillator circuit 104 performance). However, even in these examples, the oscillator signal peak-to-peak amplitude is greater than usually available in an oscillator circuit in which the oscillator signal amplitude is limited to the supply voltage (VDD).

In the example of FIG. 2, the control terminal coupling network 118 includes a first capacitor 206 that is coupled to the first BJT 110 base and to the ground terminal. The control terminal coupling network 118 also includes a second capacitor 208 that is coupled to the second BJT 112 base and to the ground terminal. In some examples, the first and second capacitors 206, 208 have approximately equal capacitance values. The control terminal coupling network 118 includes a first cross-coupled capacitor 210 coupled to the first BJT 110 base and to the second BJT 112 collector. The control terminal coupling network 118 also includes a second cross-coupled capacitor 212 coupled to the second BJT 112 base and to the first BJT 110 collector. In some examples, the first and second cross-coupled capacitors 210, 212 have approximately equal capacitance values.

The capacitors 206-212 form a capacitor divider that reduces the voltage swing at the bases of the first and second BJTs 110, 112 relative to the voltage swing at the collectors of the first and second BJTs 110, 112 (e.g., the oscillator signal). Reducing the voltage swing at the bases of the first and second BJTs 110, 112 avoids saturating the BJTs 110, 112. Reducing this voltage swing also reduces flicker noise up-conversion of the oscillator and nonlinearities as described above.

In the example of FIG. 2, the second terminal coupling network 120 includes a series inductor-capacitor circuit coupled to the first BJT 110 emitter and to the second BJT 112 emitter. In particular, the series inductor-capacitor circuit includes a third capacitor 214 coupled to the first BJT 110 emitter, and inductor 216 coupled to the third capacitor 214, and a fourth capacitor 218 coupled to the inductor 216 and to the second BJT 112 emitter. In this example, the second terminal coupling network 120 provides stability for the oscillator circuit 104 by having a resonant frequency approximately equal to the resonant frequency of the MEMS resonator 102. Accordingly, gain of the oscillator circuit 104 is enhanced at frequencies around the resonant frequency of the MEMS resonator 102. This reduces the tendency of the oscillator circuit 104 to oscillate at frequencies other than the resonant frequency of the MEMS resonator 102. In some examples, the second terminal coupling network 120 has a common mode resonant frequency at a second harmonic, which reduces noise present in the oscillator circuit 104. The resistors 122, 124 provide an emitter degeneration that reduces gain away from the resonant frequency of the second terminal coupling network 120. The resistors 122, 124 also limit the current through the oscillator circuit 104, which provides amplitude and frequency stability.

In the example of FIG. 2, the control terminal bias network 126 includes a third transistor 220 (e.g., a FET) having a control terminal (e.g., a gate) that is controlled responsive to a first portion of a digital code. The third transistor 220 also has a first terminal (e.g., a source) coupled to the supply voltage terminal 116 and a second terminal (e.g., a drain) coupled to a bias voltage terminal 221 (the voltage at which is VBIAS).

The control terminal bias network 126 also includes a fourth transistor 222 (e.g., a FET) having a control terminal (e.g., a gate) that is controlled responsive to a second portion of the digital code. The fourth transistor 222 also has a first terminal (e.g., a drain) coupled to the bias voltage terminal 221 and a second terminal (e.g., a source) coupled to a ground terminal.

The bias voltage terminal 221 provides VBIAS as the programmable bias voltage. In a particular example, a digital code (e.g., an n-bit digital value) includes a first portion (e.g., a fine select portion) and a second portion (e.g., a coarse select portion). As one example, the coarse select portion includes the most significant m bits of the n-bit digital code and the fine select portion includes the remaining n-m bits of the n-bit digital code. For example, n may be equal to 10 bits and m is 8 bits.

The control terminal bias network 126 also includes a first variable resistor 224 coupled to the third transistor 220 and to the bias voltage terminal 221, and includes a second variable resistor 226 coupled to the fourth transistor 222 and to the bias voltage terminal 221. The transistors 220, 222 and the variable resistors 224, 226 are shown for schematic simplicity. Functionally, the third transistor 220 and the first variable resistor 224 provide a varying voltage drop responsive to different values of the first portion of the digital code. Similarly, the fourth transistor 222 and the second variable resistor 226 provide a varying voltage drop responsive to different values of the second portion of the digital code.

In one example, the third transistor 220 is implemented as a first group of transistors and the fourth transistor 222 is implemented as a second group of transistors. In this example, the first variable resistor 224 is implemented as a first group of resistors and the second variable resistor 226 is implemented as a second group of resistors. Each of the first group of transistors is coupled to the supply voltage terminal 116 and to one of the first group of resistors. Each of the second group of transistors is coupled to the ground terminal and to one of the second group of resistors.

Responsive to the first portion of the digital code, one of the first group of transistors is on and the remainder of the first group of transistors is off, which selects one of the first group of resistors. Responsive to the second portion of the digital code, one of the second group of transistors is on and the remainder of the second group of transistors is off, which selects one of the second group of resistors.

Thus, a voltage dropped across the first variable resistor 224 varies with the fine select portion of the digital code. Similarly, a voltage dropped across the second variable resistor 226 varies with the coarse select portion of the digital code. Thus, the resulting VBIAS at the bias voltage terminal 221 is a function of the n-bit digital code. Accordingly, VBIAS is programmable to control operation of the first and second BJTs 110, 112 across various conditions (e.g., across process and temperature) so the oscillator circuit 104 provides sufficiently low phase noise irrespective of those conditions. Also, in the example of FIG. 2, a third resistor 228 couples the bias voltage terminal 221 to the base of the first BJT 110 and a fourth resistor 230 couples the bias voltage terminal 221 to the base of the second BJT 112. The third and fourth resistors 228, 230 along with the capacitors 210, 212 function as a high-pass filter to provide the oscillator signal (e.g., VOUT+ and VOUT−) to the bases of the BJTs 110, 112, while insulating the oscillator signal from VBIAS. In this example, the third and fourth resistor 228, 230 have equal resistance values.

In one example embodiment, resistors 122 and 124 each have a value around 300 ohms, and resistors 228 and 230 each have a value around 15 kilo-ohms. In this same embodiment, capacitors 206 and 208 have a value around 140 pF, capacitors 210 and 212 have a value around 108 pF and capacitors 214 and 218 have values around 1.1 pF. Inductor 216 has a value around 6.4 nH resulting in a Q value around 8 and a series resonant frequency around 10 GHz. The primary coil 202 and second coil 204 have values around 28 nH and 17 nH resulting in a Q value around 5 and a series resonant frequency around 3.2 GHz.

Figure 3A:
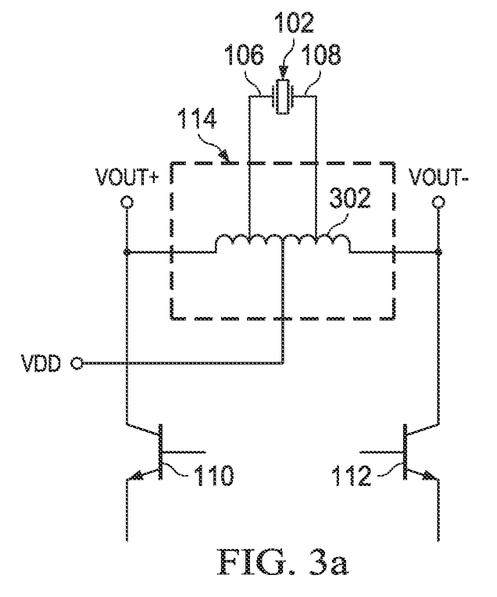
FIGS. 3*a* and 3*b* are schematic diagrams of different resonator coupling networks in various examples.

FIG. 3a is a schematic diagram of a different resonator coupling network 114 in some examples. Like-numbered elements in FIG. 3a function similarly to those described above with respect to FIGS. 1 and 2. In the example of FIG. 3a, the resonator coupling network 114 includes autotransformer 302. The autotransformer 302 is coupled between oscillator circuit output terminals (VOUT+ and VOUT−) and the MEMS resonator 102 terminals 106, 108. The autotransformer 302 is implemented as a transformer with a turns ratio of N:1, where the turns ratio is selected for different performance and/or power consumption characteristics as described above. In this example, the entire coil of autotransformer 302 is the primary coil (e.g., having a number of turns n) coupled to the output terminals VOUT+ and VOUT−. Accordingly, a portion of the primary coil of autotransformer 302 functions as the secondary coil (e.g., having a number of turns m, where m is a subset of n) coupled to the terminals 106, 108 of the MEMS resonator 102.

Figure 3B:
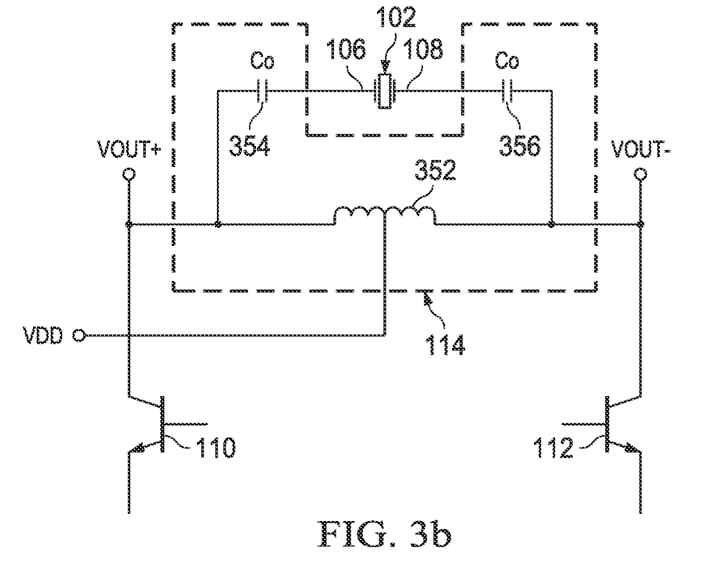

FIG. 3b is a schematic diagram of another resonator coupling network 114 in some examples. Like-numbered elements in FIG. 3b function similarly to those described above with respect to FIGS. 1 and 2. In the example of FIG. 3b, the resonator coupling network 114 includes an inductor 352 coupled between oscillator circuit output terminals (VOUT+ and VOUT−). The resonator coupling network 114 also includes a first capacitor 354 coupled to the positive output terminal VOUT+ and to the terminal 106 of the MEMS resonator 102, and a second capacitor 356 coupled to the negative output terminal VOUT− and to the terminal 108 of the MEMS resonator 102. In the example of FIG. 3b, the capacitors 354, 356 transform impedance between the MEMS resonator 102 and the oscillator circuit 104 (e.g., seen at the oscillator circuit output terminals VOUT+ and VOUT−). The capacitance Co of the capacitors 354, 356 provides the extent of the impedance transformation. Similar to the transformer 114 described in examples above, the inductor 352 effectively cancels some or all of the base capacitance of the BJTs 110, 112, which allows for larger BJTs 110, 112 having lower transconductance (gm). Also, in the example of FIG. 3b, the capacitive transformer provides a useful quality factor and thus performance and efficiency.

Figure 4:
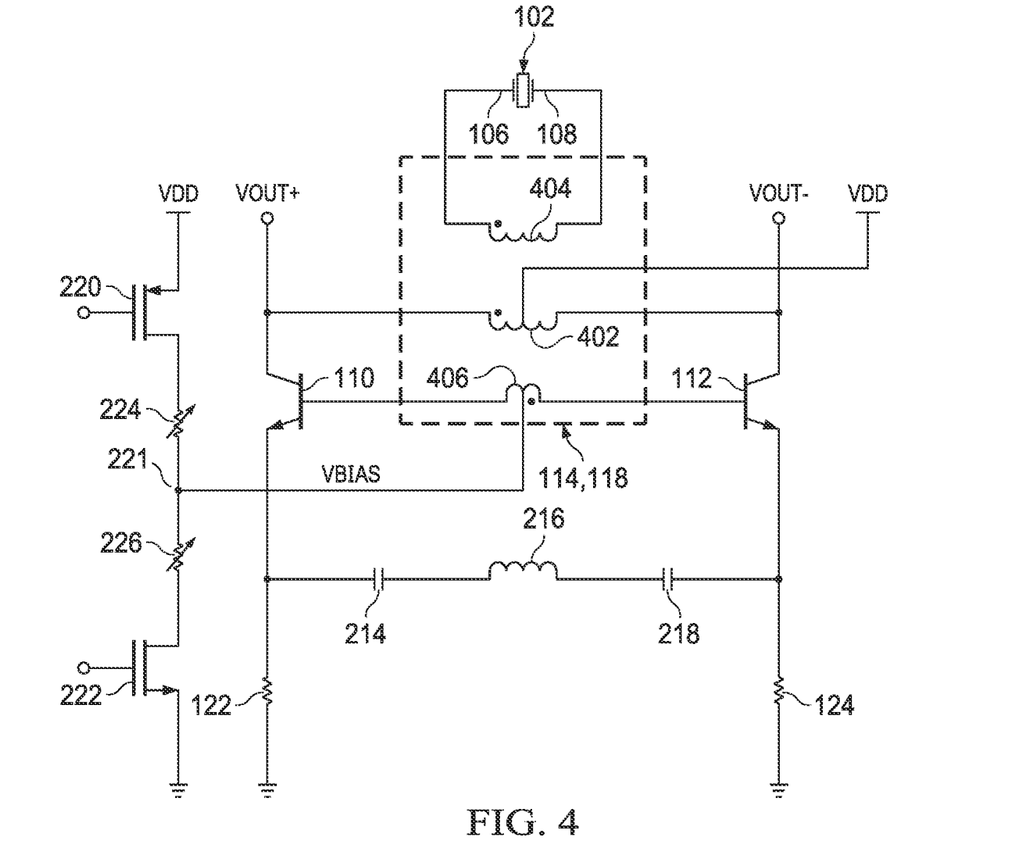
FIG. 4 is a schematic diagram of a MEMS resonator coupled to an oscillator circuit with coupling networks in various examples.

FIG. 4 is a schematic diagram of a different resonator coupling network 114 and control terminal coupling network 118 in some examples. Like-numbered elements in FIG. 4 function similarly to those described above with respect to FIGS. 1 and 2. In the example of FIG. 4, the resonator coupling network 114 and the control terminal coupling network 118 are implemented as a transformer including primary coil 402 (e.g., similar to the primary coil 202 described above), secondary coil 404 (e.g., similar to the secondary coil 204 described above), and a tertiary coil 406. The tertiary coil 406 is directly coupled to the control terminals of the BJTs 110, 112. The tertiary coil 406 is also inductively coupled to the primary and secondary coils 402, 404 of the transformer. Thus, in the example of FIG. 4, the primary and secondary coils 402, 404 function as the resonator coupling network 114 described above. The tertiary coil 406 functions as the control terminal coupling network 118. For example, the tertiary coil 406 reduces the voltage swing at the bases of the first and second BJTs 110, 112 relative to the voltage swing at the collectors of the BJTs 110, 112 by having fewer turns than the primary coil 402. In this example, the tertiary coil 406 also achieves cross-coupling of the BJTs 110, 112 by having its windings in the opposite direction of the windings of the primary coil 402. In other examples, such as where the BJTs 110, 112 are replaced by FETs, the tertiary coil 406 increases the voltage swing at the gates of the FETs by having an equal or greater number of turns than the primary coil 402.

Figure 5:
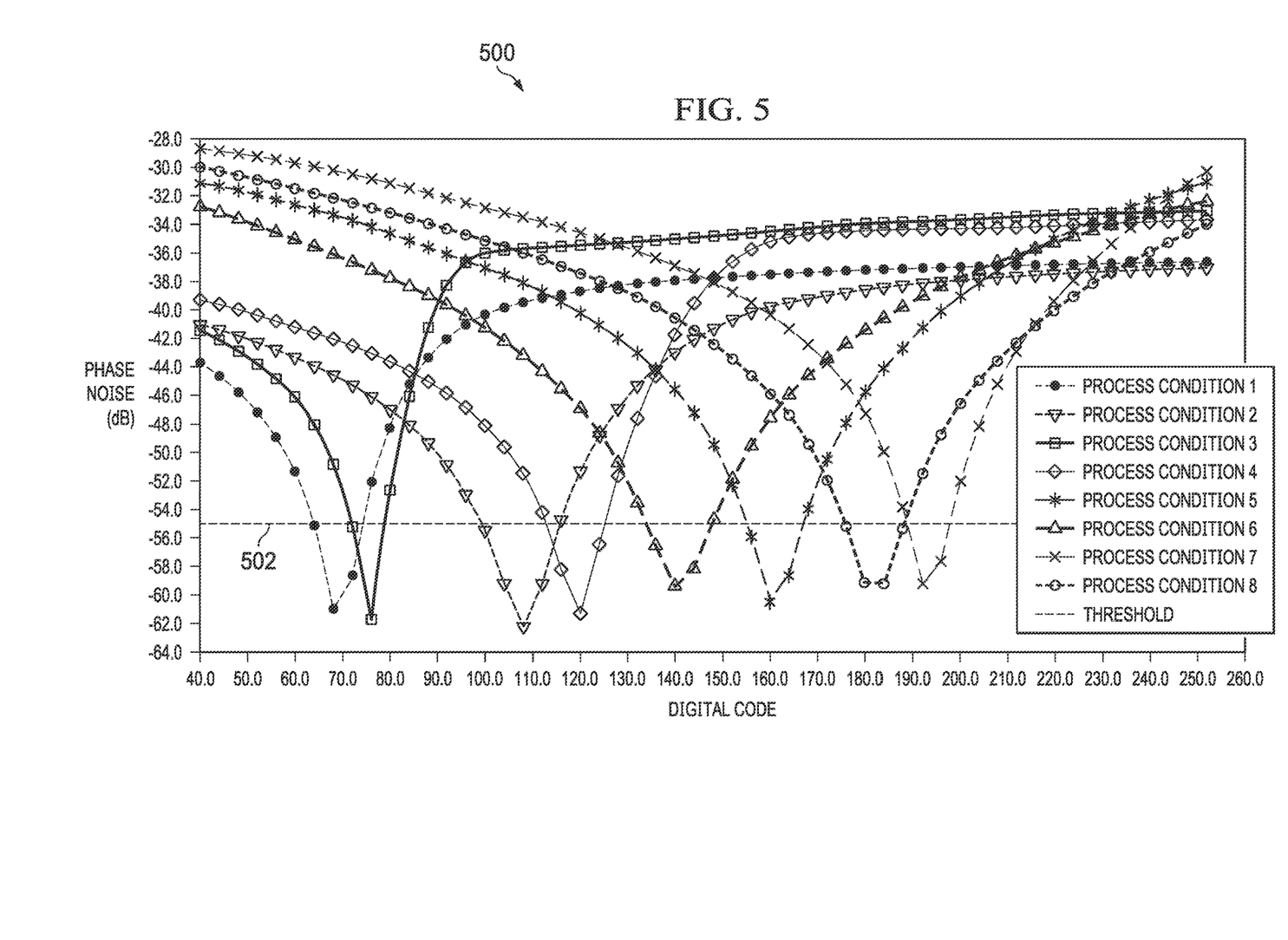
FIG. 5 is a graph of signal waveforms that represent phase noise performance across process and temperature using a control terminal bias network in various examples.

FIG. 5 is a graph 500 of waveforms that represent phase noise performance across process and temperature using a control terminal bias network 126 in various examples. In the graph 500, the y-axis represents phase noise (e.g., in dB) and the x-axis represents different values of digital codes provided to the control terminal bias network 126 as described. In the graph 500, the different waveforms correspond to different process conditions as indicated in the legend. FIG. 5 thus demonstrates that across varying process conditions, a digital code exists that, responsive to being provided to the control terminal bias network 126, provides phase noise performance below a threshold 502.

The examples above are primarily described with respect to the first and second transistors 110, 112 being BJTs. However, in other examples, the first and second transistors 110, 112 are FETs. In examples in which the first and second transistors 110, 112 are FETs, the control terminal coupling network 118 is instead designed to increase the gate voltage swing relative to the drain voltage swing (rather than to reduce such swings as described in examples in which the first and second transistors 110, 112 are BJTs). This enables the FETs 110, 112 to achieve hard switching. Accordingly, the FETs 110, 112 behave more closely to ideal switches and reduce the noise that the FETs 110, 112 provide to the output terminals VOUT+ and VOUT−.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground voltage potential" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means+/−10 percent of the stated value.

While particular transistor structures are referred to above, other transistors or device structures may be used instead. For example, p-type MOSFETs may be used in place of n-type MOSFETs (and vice versa) with little or no additional changes. In addition, different transistors (such as MOSFETs, PNP BJTs or other types of transistors) may be utilized in place of the transistors shown. The capacitors may be implemented using different device structures (such as metal structures formed over each other to form a parallel plate capacitor) or may be formed on layers (metal or doped semiconductors) closer to or farther from the semiconductor substrate surface. The inductors and transformers may be formed over a semiconductor substrate or as a separate component.

As used above, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

Modifications are possible in the described examples, and other examples are possible, within the scope of the claims.

What is claimed is:

1. A device, comprising:
   a microelectromechanical system (MEMS) resonator having terminals; and
   an oscillator circuit coupled to the MEMS resonator, the oscillator circuit including:
      a first transistor having a first control terminal-, a first current terminal and a second current terminal;
      a second transistor having a second control terminal, a third current terminal and a fourth current terminal;
      a resonator coupling network configured to:
         inductively couple the MEMS resonator terminals to the first current terminal and to the third current terminal; and
         couple the first current terminal to the third current terminal;
      a control terminal coupling network configured to:
         couple the first control terminal to the second control terminal; and
         reduce a voltage swing at the first and second transistor control terminals relative to a voltage swing at the first and third current terminals; and
      a second terminal coupling network configured to couple the second current terminal to the fourth current terminal, wherein the second terminal coupling network has a resonant frequency approximately equal to a resonant frequency of the MEMS resonator.

2. The device of claim 1, wherein the oscillator circuit includes a control terminal bias network configured to provide a programmable bias voltage to the control terminal coupling network.

3. The device of claim 2, wherein the control terminal bias network includes:
   a third transistor having a third control terminal configured to receive a first voltage indicating a first portion of a digital code, a fifth current terminal coupled to a supply voltage terminal, and a sixth current terminal coupled to a bias voltage terminal; and
   a fourth transistor having a fourth control terminal configured to receive a second voltage indicating a second portion of the digital code, a seventh current terminal coupled to the bias voltage terminal, and an eighth current terminal coupled to a ground terminal;
   wherein a voltage at the bias voltage terminal is the programmable bias voltage.

4. The device of claim 1, wherein the resonator coupling network is a transformer including:
   a primary coil coupled to the first current terminal and to the third current terminal; and
   a secondary coil coupled to the MEMS resonator terminals.

5. The device of claim 4, wherein the primary coil is coupled to a supply voltage terminal, the first current terminal is a positive output terminal, and the third current terminal is a negative output terminal.

6. The device of claim 4, wherein the transformer is an autotransformer, the primary coil of the autotransformer has a number of turns (n) and the secondary coil is a subset of the primary coil having a number of turns (m).

7. The device of claim 4, wherein the transformer includes a tertiary coil and the control terminal coupling network includes the tertiary coil coupled to the first control terminal and to the second control terminal.

8. The device of claim 1, wherein the control terminal coupling network includes:
   a first capacitor coupled to the first control terminal and to a ground terminal;
   a second capacitor coupled to the second control terminal and to a ground terminal;
   a first cross-coupled capacitor coupled to the first control terminal and to the third current terminal; and
   a second cross-coupled capacitor coupled to the second control terminal and to the first current terminal.

9. The device of claim 1, wherein the second terminal coupling network includes a series inductor-capacitor circuit coupled to the second current terminal and to the fourth current terminal.

10. The device of claim 9, wherein the series inductor-capacitor circuit includes:
    a first capacitor coupled to the second current terminal;

an inductor coupled to the first capacitor; and
a second capacitor coupled to the inductor and to the fourth current terminal;
wherein the second terminal coupling network includes a first resistor coupled to the second current terminal and to a ground terminal and a second resistor coupled to the fourth current terminal and to the ground terminal.

11. The device of claim 1, wherein each of the first and second transistors is a bipolar junction transistor, each of the first and second control terminals is a base, each of the first and third current terminals is a collector, and each of the second and fourth current terminals is an emitter.

12. A device, comprising:
a microelectromechanical system (MEMS) resonator having a first MEMS terminal and a second MEMS terminal; and
an oscillator circuit coupled to the MEMS resonator, the oscillator circuit including:
a first transistor having a first control terminal, a first current terminal and a second current terminal;
a second transistor having a second control terminal, a third current terminal and a fourth current terminal;
a transformer including a primary coil coupled to the first current terminal and the third current terminal, and a secondary coil coupled to the first and second MEMS terminals;
a control terminal coupling network coupled between the first and second control terminals; and
a second terminal coupling network coupled between the second and fourth current terminals, the second terminal coupling network comprising a first capacitor, an inductor and a second capacitor coupled in series between the second and fourth current terminals.

13. The device of claim 12, wherein the control terminal coupling network includes:
a third capacitor coupled to the first control terminal and to a ground terminal;
a fourth capacitor coupled to the second control terminal and to a ground terminal;
a first cross-coupled capacitor coupled to the first control terminal and to the third current terminal; and
a second cross-coupled capacitor coupled to the second control terminal and to the first current terminal.

14. The device of claim 12, wherein the control terminal coupling network includes a tertiary coil of the transformer.

15. The device of claim 12, wherein the oscillator circuit includes a control terminal bias network configured to provide a programmable bias voltage to the control terminal coupling network.

16. The device of claim 15, wherein the control terminal bias network includes:
a third transistor having a third control terminal configured to receive a first voltage indicating a first portion of a digital code, a fifth current terminal coupled to a supply voltage terminal, and a sixth current terminal coupled to a bias voltage terminal; and
a fourth transistor having a fourth control terminal configured to receive a second voltage indicating a second portion of the digital code, a seventh current terminal coupled to the bias voltage terminal, and an eighth current terminal coupled to a ground terminal;
wherein a voltage at the bias voltage terminal is the programmable bias voltage.

17. The device of claim 12, wherein the primary coil is coupled to a supply voltage terminal, the first current terminal is a positive output terminal, and the third current terminal is a negative output terminal.

18. The device of claim 12, wherein the transformer is an autotransformer, the primary coil of the autotransformer has a number of turns (n) and the secondary coil is a subset of the primary coil having a number of turns (m).

19. A device, comprising:
a microelectromechanical system (MEMS) resonator having a first MEMS terminal and a second MEMS terminal; and
an oscillator circuit coupled to the MEMS resonator, the oscillator circuit including:
a first transistor having a first control terminal, a first current terminal and a second current terminal;
a second transistor having a second control terminal, a third current terminal and a fourth current terminal; and
a coupling network configured to couple the second current terminal to the fourth current terminal, wherein the coupling network has a resonant frequency approximately equal to a resonant frequency of the MEMS resonator; and
a transformer including:
a primary coil coupled to the first control terminal and to the second control terminal;
a secondary coil coupled to the first MEMS terminal and the second MEMS terminal; and
a tertiary coil coupled to the first control terminal and the second control terminal.

20. The device of claim 19, wherein the oscillator circuit includes a control terminal bias network configured to provide a programmable bias voltage to the tertiary coil.

21. The device of claim 20, wherein the control terminal bias network includes:
a third transistor having a third control terminal configured to receive a first voltage indicating a first portion of a digital code, a fifth current terminal coupled to a supply voltage terminal, and a sixth current terminal coupled to a bias voltage terminal; and
a fourth transistor having a fourth control terminal configured to receive a second voltage indicating a second portion of the digital code, a seventh current terminal coupled to the bias voltage terminal, and an eighth current terminal coupled to a ground terminal;
wherein a voltage at the bias voltage terminal is the programmable bias voltage.

* * * * *